(12) United States Patent
Lee et al.

(10) Patent No.: US 11,139,212 B2
(45) Date of Patent: Oct. 5, 2021

(54) SEMICONDUCTOR ARRANGEMENT AND METHOD FOR MAKING

(71) Applicant: TAIWAN SEMICONDUCTOR MANUFACTURING COMPANY LIMITED, Hsin-Chu (TW)

(72) Inventors: Yueh-Chuan Lee, Hsinchu (TW); Chia-Chan Chen, Zhubei (TW)

(73) Assignee: TAIWAN SEMICONDUCTOR MANUFACTURING COMPANY LIMITED, Hsin-Chu (TW)

( * ) Notice: Subject to any disclaimer, the term of this patent is extended or adjusted under 35 U.S.C. 154(b) by 0 days.

(21) Appl. No.: 16/577,377

(22) Filed: Sep. 20, 2019

(65) Prior Publication Data

US 2020/0105610 A1    Apr. 2, 2020

Related U.S. Application Data

(60) Provisional application No. 62/738,453, filed on Sep. 28, 2018.

(51) Int. Cl.
| | |
|---|---|
| *H01L 21/8234* | (2006.01) |
| *H01L 29/40* | (2006.01) |
| *H01L 21/311* | (2006.01) |
| *H01L 21/768* | (2006.01) |
| *H01L 29/423* | (2006.01) |

(Continued)

(52) U.S. Cl.
CPC .. *H01L 21/823475* (2013.01); *H01L 21/0274* (2013.01); *H01L 21/31111* (2013.01);
(Continued)

(58) Field of Classification Search
CPC ....... H01L 21/823475; H01L 21/31144; H01L 21/31111; H01L 21/76877; H01L 21/76802; H01L 21/0274; H01L 21/3212; H01L 29/401; H01L 29/42356; H01L 29/41726; H01L 29/6568; H01L 23/528; H01L 23/535; H01L 27/088; H01L 27/0207
USPC ............... 257/506, 288, 384, 390, 774, 775, 257/E27.012, E27.062, E27.081, E27.098, 257/E29.158, E29.255, E29.265, E29.266, 257/E21.038, E21.159, E21.444, E21.59; 438/199, 241, 260, 262, 675
See application file for complete search history.

(56) References Cited

U.S. PATENT DOCUMENTS

6,724,085 B2 * 4/2004 Tomita ............ H01L 21/823475
                                                        257/758
6,900,513 B2 * 5/2005 Natsume ................. H01L 27/11
                                                        257/296

(Continued)

FOREIGN PATENT DOCUMENTS

| KR | 20040009792 A | 1/2004 |
|---|---|---|
| KR | 20110092836 | 8/2011 |

(Continued)

*Primary Examiner* — Dao H Nguyen
(74) *Attorney, Agent, or Firm* — Cooper Legal Group LLC

(57) ABSTRACT

A semiconductor arrangement is provided. The semiconductor arrangement includes a first conductive element over a substrate and a second conductive element over the substrate. A dielectric region is over a top surface of the substrate and between the first conductive element and the second conductive element. An electrically conductive structure is over the first conductive element, the second conductive element, and the dielectric region.

20 Claims, 6 Drawing Sheets

(51) Int. Cl.
*H01L 29/417* (2006.01)
*H01L 21/027* (2006.01)
*H01L 27/088* (2006.01)
*H01L 23/528* (2006.01)
*H01L 21/321* (2006.01)

(52) U.S. Cl.
CPC .. *H01L 21/31144* (2013.01); *H01L 21/76802* (2013.01); *H01L 21/76877* (2013.01); *H01L 23/528* (2013.01); *H01L 27/088* (2013.01); *H01L 29/401* (2013.01); *H01L 29/41725* (2013.01); *H01L 29/42356* (2013.01); *H01L 21/3212* (2013.01); *H01L 21/7684* (2013.01)

(56) References Cited

U.S. PATENT DOCUMENTS

| | | | |
|---|---|---|---|
| 7,977,800 B2 * | 7/2011 | Oosuka | H01L 21/823425 257/774 |
| 2001/0045589 A1 * | 11/2001 | Takeda | G11C 15/043 257/297 |
| 2004/0009639 A1 * | 1/2004 | Nishida | H01L 27/11 438/240 |
| 2004/0043550 A1 * | 3/2004 | Chakihara | H01L 27/1116 438/199 |
| 2007/0134909 A1 * | 6/2007 | Klee | H01L 21/76816 438/620 |
| 2007/0145519 A1 * | 6/2007 | Peng | H01L 21/823481 257/506 |
| 2011/0195569 A1 | 8/2011 | Moon et al. | |
| 2018/0286957 A1 * | 10/2018 | Bae | H01L 27/1104 |

FOREIGN PATENT DOCUMENTS

| | | |
|---|---|---|
| TW | 200608520 A | 3/2006 |
| TW | 200802811 A | 1/2008 |
| TW | 201709415 A | 3/2017 |

* cited by examiner

SEMICONDUCTOR ARRANGEMENT AND METHOD FOR MAKING

RELATED APPLICATIONS

This application claims priority to U.S. Provisional Application 62/738,453, titled "SEMICONDUCTOR ARRANGEMENT AND METHOD OF MAKING" and filed on Sep. 28, 2018, which is incorporated herein by reference.

BACKGROUND

Semiconductor arrangements comprise components, such as active devices, passive devices, and others. Dielectrics insulate some of the components from other components. Conductors couple some components to other components.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
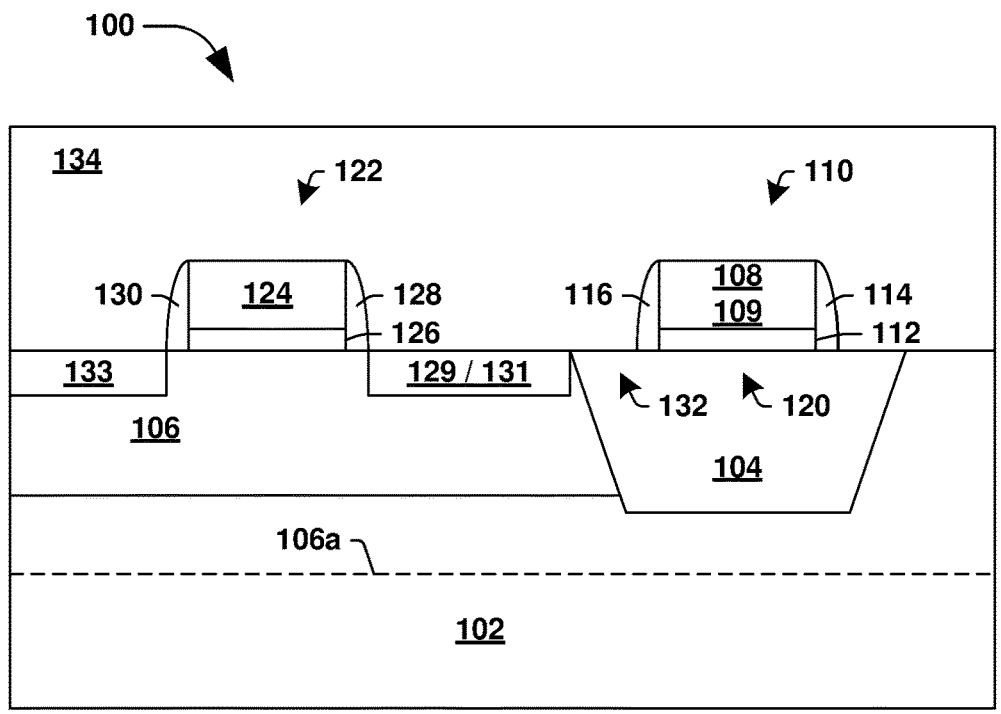
FIGS. 1-6 illustrate an example semiconductor arrangement at various stages of fabrication, in accordance with some embodiments.

The following disclosure provides several different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals or letters in the various examples. This repetition is for the purpose of simplicity and clarity and does not in itself dictate a relationship between the various embodiments or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the arrangement in use or operation in addition to the orientation depicted in the figures. The apparatus may be otherwise oriented (rotated 90 degrees or at other orientations) and the spatially relative descriptors used herein may likewise be interpreted accordingly.

Some embodiments relate to a semiconductor arrangement and a method for fabricating a semiconductor arrangement. According to some embodiments, the semiconductor arrangement comprises a dielectric region under a butted contact and a between a first conductive element and a second conductive element. The butted contact is a conductive element that is over the first conductive element and the second conductive element, and electrically couples the first conductive element to the second conductive element. The dielectric region is over a top surface of a substrate, wherein the first conductive element is at least one of over the substrate or in the substrate and the second conductive element is at least one of over the substrate or in the substrate. The dielectric region inhibits current leakage between a well in the substrate and the butted contact.

FIG. 1 illustrates an example semiconductor arrangement 100, in accordance with some embodiments.

At least some of the semiconductor arrangement 100 is formed at least one of on or in a substrate 102. According to some embodiments, the substrate 102 comprises at least one of an epitaxial layer, a silicon-on-insulator (SOI) structure, a wafer, or a die formed from a wafer. According to some embodiments, the substrate 102 comprises at least one of Silicon (Si), Germanium (Ge), Indium Gallium Arsenide (InGaAs), Gallium Arsenide (GaAs), Indium Antimonide (InSb), Gallium Phosphide (GaP), Gallium Antimonide (GaSb), Indium Aluminum Arsenide (InAlAs), Gallium Antimony Phosphide (GaSbP), Gallium Arsenide Antimonide (GaAsSb), Indium Phosphide (InP), or other suitable material.

According to some embodiments, the semiconductor arrangement 100 comprises an isolation feature. In some instances the isolation feature is called as a shallow trench isolation (STI) region 104 in the substrate 102. According to some embodiments, the STI region 104 comprises a dielectric material. According to some embodiments, the STI region 104 comprises at least one of oxide, nitride, or other suitable material.

According to some embodiments, the semiconductor arrangement 100 comprises a well 106 in the substrate 102. According to some embodiments, the well 106 comprises dopants implanted into the substrate 102. According to some embodiments, the well 106 comprises an n-type dopant. According to some embodiments, the well 106 comprises at least one of Phosphorus (P), Arsenic (As), Antimony (Sb), at least one Group V element, or other suitable material. According to some embodiments, the well 106 comprises a p-type dopant. According to some embodiments, the well 106 comprises at least one of Boron (B), Aluminum (Al), Gallium (Ga), Indium (In), at least one Group III element, or other suitable material. According to some embodiments, the well 106 abuts the STI region 104. According to some embodiments, the well 106 extends below the STI region 104, as illustrated by dashed line 106a, such that a bottommost surface of the STI region 104 remains within the well 106.

According to some embodiments, the semiconductor arrangement 100 comprises a first conductive element 108 at least one of over the substrate or in the substrate 102.

According to some embodiments, the first conductive element 108 is a gate electrode 109 of a gate stack 110. According to some embodiments, the first conductive element 108 comprises a conductive material. According to some embodiments, the first conductive element 108 comprises at least one of polysilicon, metal or other suitable material. According to some embodiments, the first conductive element 108 is doped with one or more dopants.

According to some embodiments, the gate stack 110 also comprises at least one of a gate dielectric 112, a first sidewall spacer 114, or a second sidewall spacer 116. According to some embodiments, at least one of the gate dielectric 112, the first sidewall spacer 114, or the second sidewall spacer 116 comprise a dielectric material. According to some embodiments, at least one of the gate dielectric 112, the first sidewall spacer 114, or the second sidewall spacer 116 comprise at least one of oxide, nitride, or other suitable material. According to some embodiments, the gate stack 110 overlies a first portion 120 of the STI region 104.

According to some embodiments, the semiconductor arrangement 100 comprises a gate stack 122. According to some embodiments, the gate stack 122 comprises at least one of a gate electrode 124, a gate dielectric 126, a first sidewall spacer 128, or a second sidewall spacer 130. According to some embodiments, the gate electrode 124 comprises a conductive material. According to some embodiments, the gate electrode 124 comprises at least one of polysilicon, metal or other suitable material. According to some embodiments, the gate electrode 124 is doped with one or more dopants. According to some embodiments, at least one of the gate dielectric 126, the first sidewall spacer 128, or the second sidewall spacer 130 comprise a dielectric material. According to some embodiments, at least one of the gate dielectric 126, the first sidewall spacer 128, or the second sidewall spacer 130 comprise at least one of oxide, nitride, or other suitable material.

According to some embodiments, the semiconductor arrangement 100 comprises a second conductive element 129 at least one of over the substrate or in the substrate 102. According to some embodiments, the second conductive element 129 is a source/drain region 131. According to some embodiments, the source/drain region 131 comprises dopants implanted into the substrate 102. According to some embodiments, the source/drain region 131 comprises an n-type dopant. According to some embodiments, the source/drain region 131 comprises at least one of Phosphorus (P), Arsenic (As), Antimony (Sb), at least one Group V element, or other suitable material. According to some embodiments, the source/drain region 131 comprises a p-type dopant. According to some embodiments, the source/drain region 131 comprises at least one of Boron (B), Aluminum (Al), Gallium (Ga), Indium (In), at least one Group III element, or other suitable material. According to some embodiments, the source/drain region 131 is in the well 106. According to some embodiments, the source/drain region 131 comprises a same dopant type as the well 106. According to some embodiments, the source/drain region 131 comprises a different dopant type than the well 106. According to some embodiments, the source/drain region 131 comprises a dopant concentration greater than a dopant concentration of the well 106. According to some embodiments, the source/drain region 131 comprises a dopant concentration less than a dopant concentration of the well 106. According to some embodiments, the second conductive element 129 is separated or spaced apart from the first conductive element 108 by a second portion 132 of the STI region 104.

According to some embodiments, the semiconductor arrangement 100 comprises a second source/drain region 133. According to some embodiments, the second source/drain region 133 comprises dopants implanted into the substrate 102. According to some embodiments, the second source/drain region 133 comprises an n-type dopant. According to some embodiments, the second source/drain region 133 comprises at least one of Phosphorus (P), Arsenic (As), Antimony (Sb), at least one Group V element, or other suitable material. According to some embodiments, the second source/drain region 133 comprises a p-type dopant. According to some embodiments, the second source/drain region 133 comprises at least one of Boron (B), Aluminum (Al), Gallium (Ga), Indium (In), at least one Group III element, or other suitable material. According to some embodiments, the second source/drain region 133 is in the well 106. According to some embodiments, the second source/drain region 133 comprises a same dopant type as the well 106. According to some embodiments, the second source/drain region 133 comprises a different dopant type than the well 106. According to some embodiments, the second source/drain region 133 comprises a dopant concentration greater than a dopant concentration of the well 106. According to some embodiments, the second source/drain region 133 comprises a dopant concentration less than a dopant concentration of the well 106. According to some embodiments, the second source/drain region 133 is diametrically opposite the source/drain region 131 relative to the gate stack 122.

According to some embodiments, a dielectric layer 134 is formed, such as deposited, over at least one of the gate stack 110, the source/drain region 131, the second source/drain region 133, the gate stack 122, exposed portions of the substrate 102, exposed portions of the well 106, or exposed portions of the STI region 104. According to some embodiments, the dielectric layer 134 is formed by at least one of chemical vapor deposition (CVD), low pressure CVD (LPCVD), plasma enhanced CVD (PECVD), ultra-high vacuum CVD (UHVCVD), reduced pressure CVD (RPCVD), atomic layer deposition (ALD), physical vapor deposition (PVD), pulsed laser deposition, sputtering, evaporative deposition, vapor phase epitaxy (VPE), molecular beam epitaxy (MBE), liquid phase epitaxy (LPE) or other suitable process.

According to some embodiments, the dielectric layer 134 is an interlayer dielectric (ILD) comprising a dielectric material. According to some embodiments, the dielectric layer 134 comprises at least one of silicon, a polymer, $SiO_2$, phosphosilicate glass (PSG), borophosphosilicate glass (BPSG)Tetraethyl Orthosilicate (TEOS), porous $SiO_2$, Carbon-doped $SiO_2$, porous Carbon-doped $SiO_2$, Fluorine-doped $SiO_2$, Polytetrafluoroethylene (PTFE), Benzocyclobutene, a Polynorbornene, a Polyimide (PI), Polybenzobisoxazole (PBO), Hydrogen Silsesquioxane (HSQ), Methyl Silsesquioxane (MSQ), or other suitable material.

Figure 2:
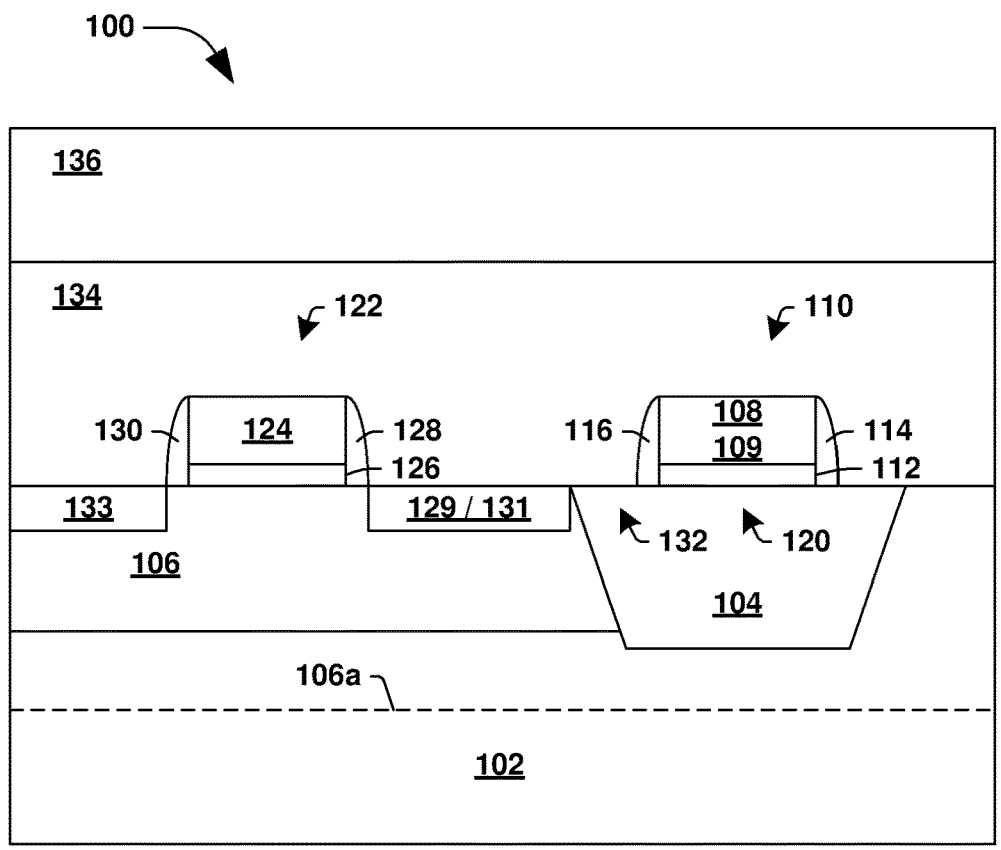

FIG. 2 illustrates a photoresist 136 formed over the dielectric layer 134, according to some embodiments. In some embodiments, the photoresist 136 is formed by at least one of spinning, spray coating, or other suitable process. The photoresist 136 comprises a light sensitive material such that properties, such as solubility, of the photoresist 136 are affected by light. The photoresist 136 is either a negative photoresist or a positive photoresist. With respect to a negative photoresist, regions of the negative photoresist become insoluble when illuminated by a light source such that application of a solvent to the negative photoresist during a subsequent development stage removes non-illuminated regions of the negative photoresist. A pattern formed in the negative photoresist is thus a negative of a pattern defined by opaque regions of a template between the light source and the negative photoresist. In a positive photoresist, illuminated regions of the positive photoresist become soluble and are removed via application of a solvent during development. Thus, a pattern formed in the positive photoresist is a positive image of opaque regions of the template between the light source and the positive photoresist.

Figure 3:
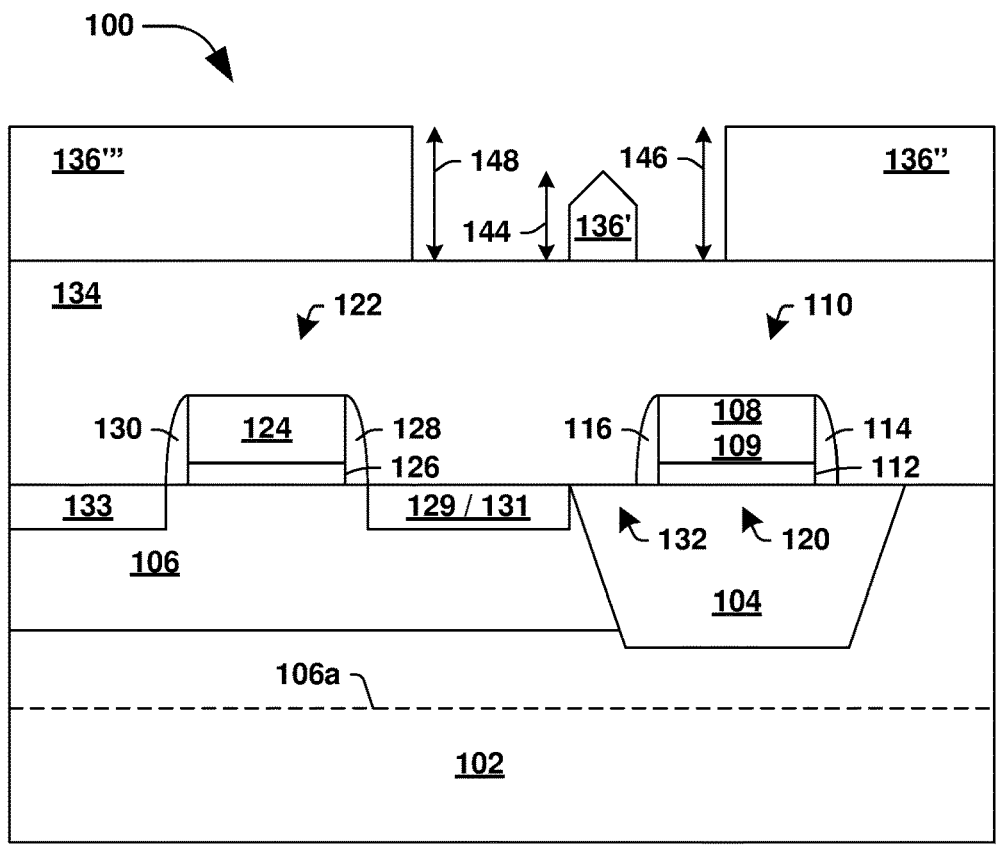

FIG. 3 illustrates the photoresist 136 patterned to define at least a first mask pattern 136', a second mask pattern 136", and a third mask pattern 136'", according to some embodiments. In some embodiments, the first mask pattern 136' overlies the second portion 132 of the STI region 104. According to some embodiments, the second mask pattern 136" overlies a portion of the first conductive element 108. According to some embodiments, the third mask pattern 136'" overlies the gate stack 122. According to some embodiments, the first mask 136' has a height 144 that is less than at least one of a height 146 of the second mask pattern 136" or a height 148 of the third mask pattern 136'".

Figure 4:
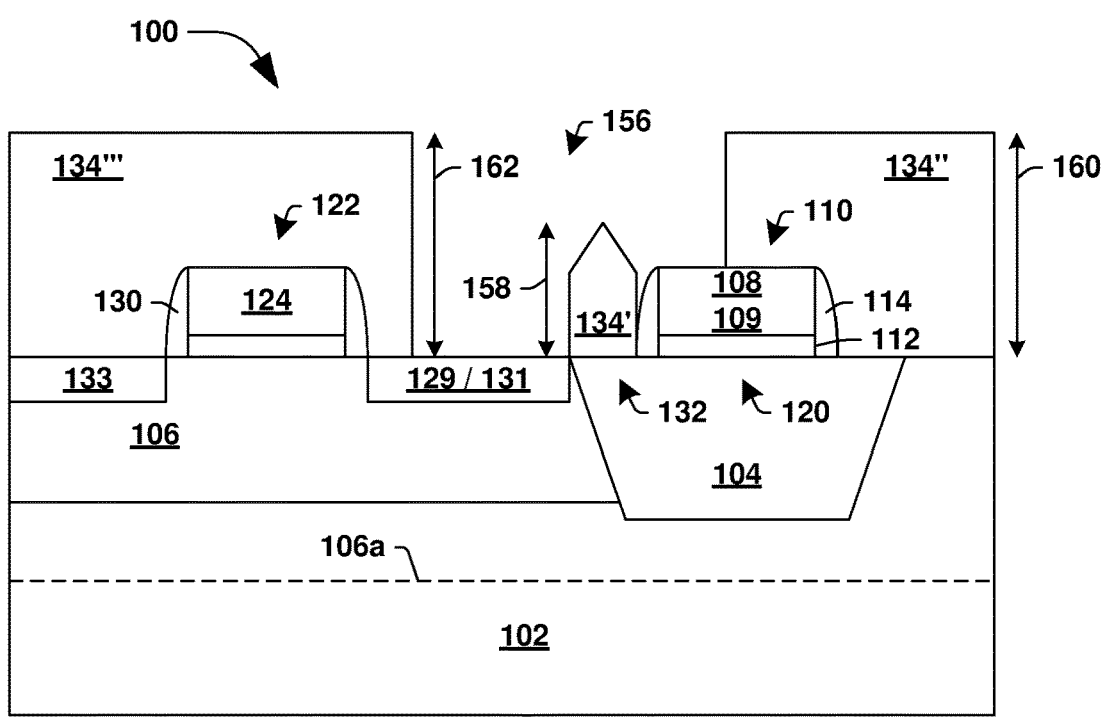

FIG. 4 illustrates the dielectric layer 134 patterned using the first mask pattern 136', the second mask pattern 136", and the third mask pattern 136'" of the patterned photoresist 136, according to some embodiments. According to some embodiments, the dielectric layer 134 is patterned via etching or other suitable process. According to some embodiments, the first mask pattern 136' protects a first portion 134' of the dielectric layer 134 such that the first portion 134' remains, such as as a remnant of the dielectric layer 134, after the patterning. According to some embodiments, the second mask pattern 136" protects a second portion 134" of the dielectric layer 134 such that the second portion 134" remains after the patterning. According to some embodiments, the third mask pattern 136'" protects a third portion 134'" of the dielectric layer 134 such that the third portion 134'" remains after the patterning. According to some embodiments, a recess 156 is defined between the second portion 134" of the dielectric layer 134 and the third portion 134'" of the dielectric layer 134.

According to some embodiments, due to the smaller height 144 of the first mask pattern 136' relative to at least one of the height 146 of the second mask pattern 136" or the height 148 of the third mask pattern 136'", the first portion 134' of the dielectric layer 134 remaining in the recess 156 has a height 158 that is less than at least one of a height 160 of the second portion 134" of the dielectric layer 134 or a height 162 of the third portion 134'" of the dielectric layer 134. According to some embodiments, the first portion 134' of the dielectric layer 134 is over the second portion 132 of the STI region 104.

Figure 5:
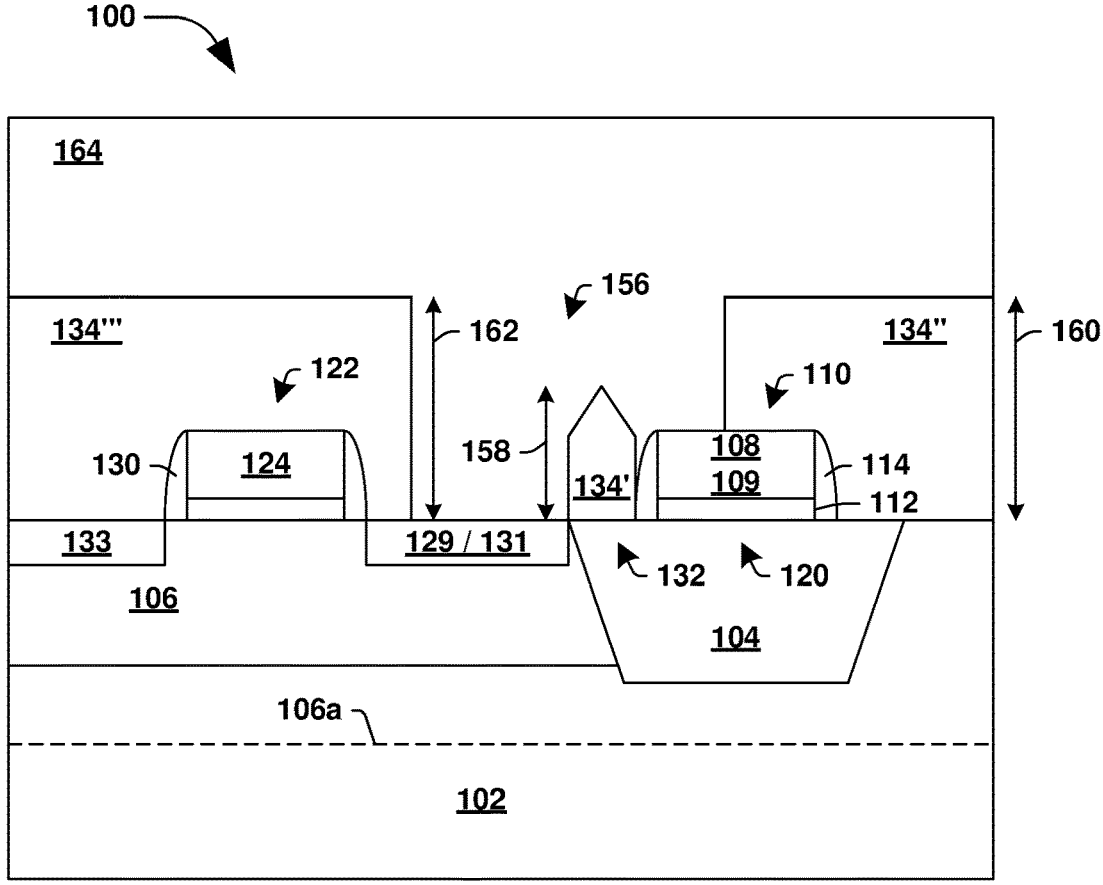

FIG. 5 illustrates a layer of conductive material 164 formed in the recess 156 and over at least one of the first portion 134' of the dielectric layer 134, the second portion 134" of the dielectric layer 134, the third portion 134'" of the dielectric layer 134, exposed portions of the gate stack 110, or exposed portions of the source/drain region 131, according to some embodiments. According to some embodiments, the layer of conductive material 164 comprises at least one of copper, tungsten, aluminum, silicon, or other suitable material. In some embodiments, the layer of conductive material 164 formed by at least one of CVD, LPCVD, PECVD, UHVCVD, RPCVD, ALD, physical vapor deposition, pulsed laser deposition, sputtering, evaporative deposition, VPE, MBE, LPE, electrochemical plating (ECP), or other suitable process.

Figure 6:
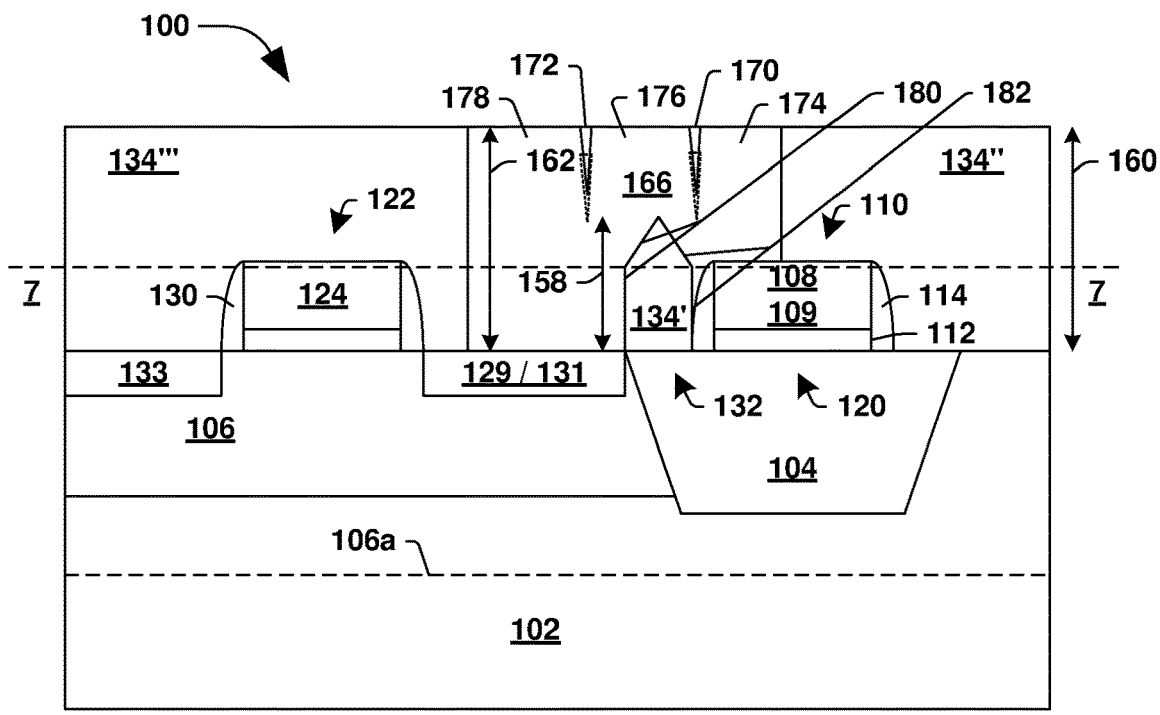

FIG. 6 illustrates excess conductive material 164 removed from the second portion 134" of the dielectric layer 134 and the third portion 134'" of the dielectric layer 134 such that a butted contact 166 remains in the recess 156 between the second portion 134" of the dielectric layer 134 and the third portion 134'" of the dielectric layer 134, according to some embodiments. According to some embodiments, the excess conductive material 164 is removed by chemical mechanical polishing (CMP) or other suitable process. According to some embodiments, an uppermost surface of the butted contact 166 is coplanar with at least one of an uppermost surface of the second portion 134" of the dielectric layer 134 or an uppermost surface of the third portion 134'" of the dielectric layer 134. According to some embodiments, the butted contact 166 is an electrically conductive structure that electrically couples the first conductive element 108 and the second conductive element 129.

According to some embodiments, the butted contact 166 defines one or more seams, such as a first seam 170 and a second seam 172. According to some embodiments, a first portion 174 of the butted contact 166 is spaced apart from a second portion 176 of the butted contact 166 by the first seam 170. According to some embodiments, the second portion 176 of the butted contact 166 is spaced apart from a third portion 178 of the butted contact 166 by the second seam 172. According to some embodiments, the first portion 134' of the dielectric layer 134 is between the first seam 170 and the second seam 172. According to some embodiments, the first portion 134' of the dielectric layer 134 underlies the second portion 176 of the butted contact 166.

According to some embodiments, at least some of the one or more seams result from at least the non-uniform depth of the recess 156, where the non-uniform depth of the recess 156 is a function of differences in height between respective heights of at least one of the first portion 134' of the dielectric layer 134, the second portion 134" of the dielectric layer 134, the third portion 134'" of the dielectric layer 134, or the gate stack 110. According to some embodiments, at least some of the one or more seams are any shape, size, etc. and are not limited to the shape(s), size(s), etc. illustrated. According to some embodiments, at least some of the one or more seams are entirely embedded or defined within the butted contact 166 such that a surface defining an uppermost portion of a seam is below an uppermost surface of the butted contact 166, as depicted by seams illustrated with dashed lines.

According to some embodiments, the first portion 134' of the dielectric layer 134 has a first sidewall 180 and a second sidewall 182 that is diametrically opposite the first sidewall 180 relative to a center of the first portion 134' of the dielectric layer 134. According to some embodiments, the butted contact 166 contacts the first sidewall 180 of the first portion 134' of the dielectric layer 134 and the second sidewall 182 of the first portion 134' of the dielectric layer 134. According to some embodiments, the first portion 134' of the dielectric layer 134 is a dielectric region between the first conductive element 108 and the second conductive element 129 and serves to inhibit current flow between the electrically conductive butted contact 166 and the well 106, such as through the second portion 132 of the STI region 104.

Figure 7:
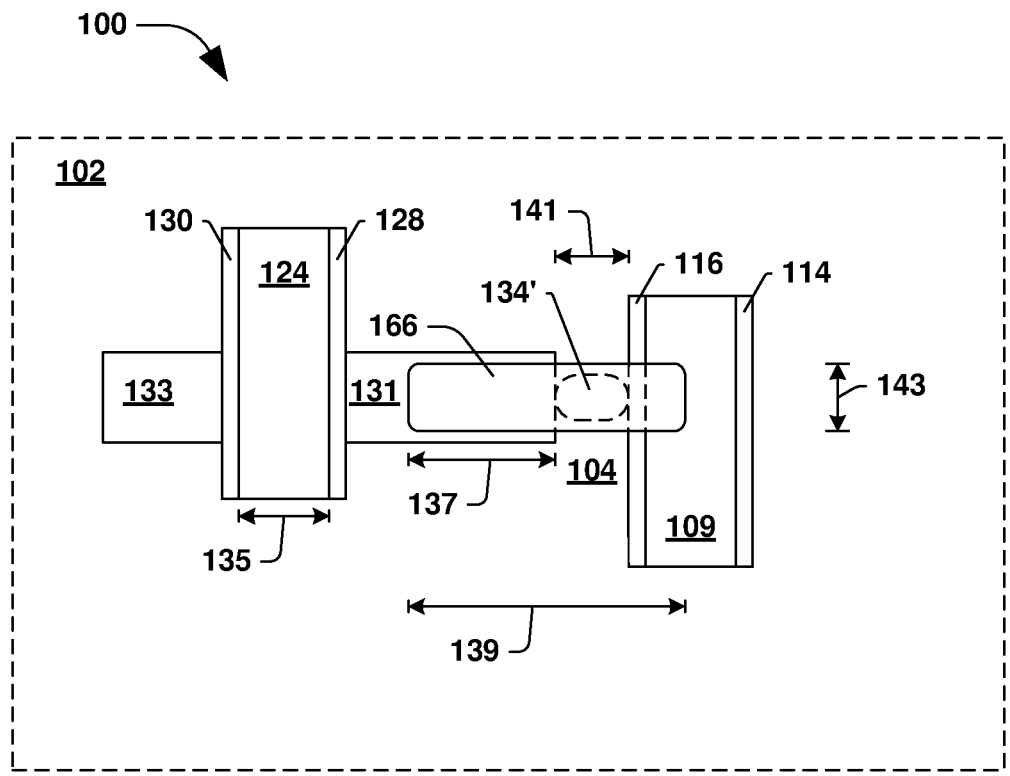
FIG. 7 illustrates a top view of the semiconductor arrangement taken along line 7-7 in FIG. 6, in accordance with some embodiments.

FIG. 7 illustrates a top view of the semiconductor arrangement 100 taken along line 7-7 in FIG. 6, but with the second portion 134" and the third portion 134'" of the dielectric layer 134 omitted for simplicity, in accordance with some embodiments. According to some embodiments, the first portion 134' of the dielectric layer 134 and portions of the source/drain region 131, the second sidewall spacer 116, and the first sidewall spacer 114 underlying the butted contact 166 are illustrated in phantom or dashed lines. According to some embodiments, a width 135 of the gate electrode 124 is about 0.08 micrometers to about 0.16 micrometers. According to some embodiments, a width 137 of the portion of the butted contact 166 overlying the source/drain region 131 is about 0.05 micrometers to about 0.15 micrometers. According to some embodiments, a width 139 of the butted contact 166 is about 0.22 micrometers to about 0.42 micrometers. According to some embodiments, a width 141 of the first portion 134' of the dielectric layer 134 is about 0.02 micrometers to about 0.12 micrometers. According to some embodiments, a thickness 143 of the butted contact 166 is about 0.1 micrometers to about 0.2 micrometers. According to some embodiments, at least some of the aforementioned dimensions facilitate desired operation, such as allowing the butted contact 166 to electrically couple conductive elements while undesired current flow between conductive elements, features, etc. is inhibited as described herein.

Figure 8:
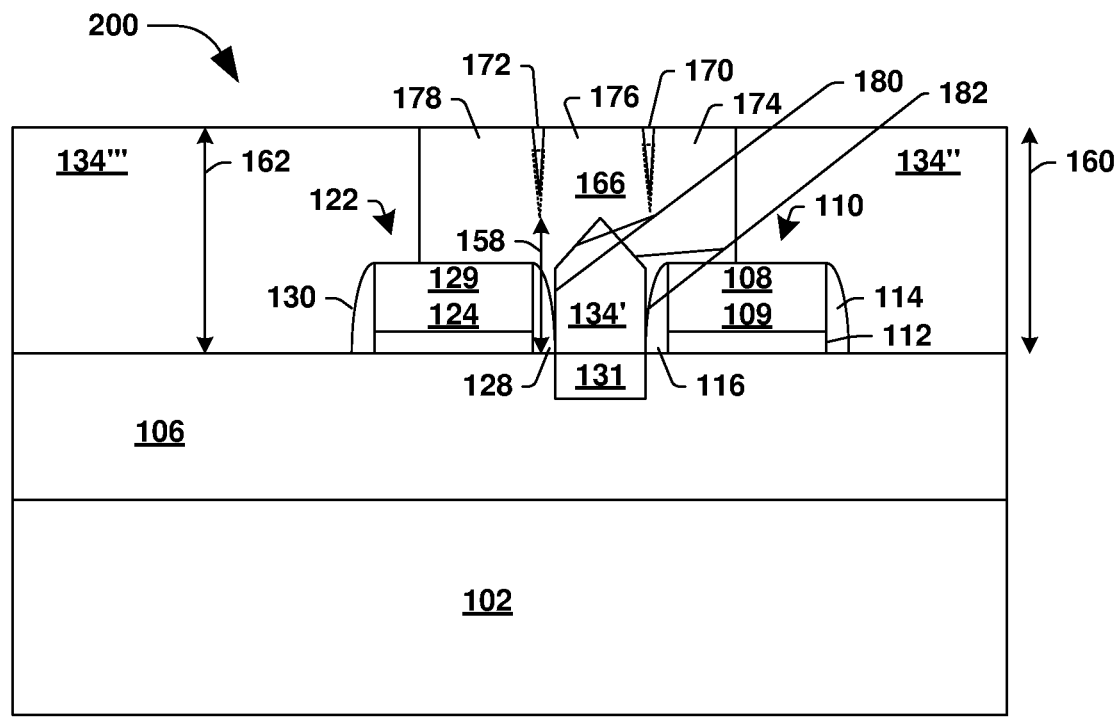
FIG. 8 illustrates an example semiconductor arrangement, in accordance with some embodiments.

FIG. 8 illustrates an example semiconductor arrangement 200, in accordance with some embodiments. According to some embodiments, many of the features present in semiconductor arrangement 200 are present in semiconductor arrangement 100 and thus like reference characters are used in FIG. 8. According to some embodiments, the semiconductor arrangement 200 is formed in in a manner similar to that described with respect to the semiconductor arrangement 100 and thus formation of the semiconductor arrangement 200 is not described in as much detail as the semiconductor arrangement 100.

To form the semiconductor arrangement 200, in accordance with some embodiments, the dielectric layer 134 is formed over at least one of the gate stack 110, the source/drain region 131, the gate stack 122, exposed portions of the substrate 102, or exposed portions of the well 106.

As described with respect to the semiconductor arrangement 100, the photoresist is formed over the dielectric layer 134, according to some embodiments. The photoresist is patterned to be define at least the first mask pattern, the second mask pattern, and the third mask pattern, according to some embodiments. In some embodiments, the first mask pattern overlies a location where the first portion 134' of the dielectric layer 134 is formed. In some embodiments, the second mask pattern overlies a location where the second portion 134" of the dielectric layer 134 is formed. According to some embodiments, the third mask pattern overlies a location where the third portion 134'" of the dielectric layer 134 is formed. According to some embodiments, the first mask pattern has the height that is less than at least one of the height of the second mask pattern or the height of the third mask pattern.

The dielectric layer 134 is patterned using the first mask pattern, the second mask pattern, and the third mask pattern of the patterned photoresist, according to some embodiments. According to some embodiments, the dielectric layer 134 is patterned via etching or other suitable process. According to some embodiments, the first mask pattern protects the first portion 134' of the dielectric layer 134 such that the first portion 134' remains after the patterning. According to some embodiments, the second mask pattern protects the second portion 134" of the dielectric layer 134 such that the second portion 134" remains after the patterning. According to some embodiments, the third mask pattern protects the third portion 134'" of the dielectric layer 134 such that the third portion 134'" remains after the patterning. According to some embodiments, the recess is defined between the second portion 134" of the dielectric layer 134 and the third portion 134'" of the dielectric layer 134.

According to some embodiments, due to the smaller height of the first mask pattern relative to at least one of the height of the second mask pattern or the height of the third mask pattern, the first portion 134' of the dielectric layer 134 remaining in the recess has the height that is less than at least one of the height of the second portion 134" of the dielectric layer 134 or the height of the third portion 134'" of the dielectric layer 134.

According to some embodiments, the layer of conductive material is formed in the recess and over at least one of the first portion 134' of the dielectric layer 134, exposed portions of the gate stack 110, or exposed portions of the gate stack 122. According to some embodiments, excess conductive material is removed from the second portion 134" of the dielectric layer 134 and the third portion 134'" of the dielectric layer 134 such that the butted contact 166 remains in the recess between the second portion 134" of the dielectric layer 134 and the third portion 134'" of the dielectric layer 134. According to some embodiments, an uppermost surface of the butted contact 166 is coplanar with at least one of an uppermost surface of the second portion 134" of the dielectric layer 134 or an uppermost surface of the third portion 134'" of the dielectric layer 134.

According to some embodiments, the butted contact 166 defines the one or more seams, such as the first seam 170 and the second seam 172. According to some embodiments, the first portion 174 of the butted contact 166 is spaced apart from the second portion 176 of the butted contact 166 by the first seam 170. According to some embodiments, the second portion 176 of the butted contact 166 is spaced apart from the third portion 178 of the butted contact 166 by the second seam 172. According to some embodiments, the first portion 134' of the dielectric layer 134 is between the first seam 170 and the second seam 172. According to some embodiments, the first portion 134' of the dielectric layer 134 underlies the second portion 176 of the butted contact 166.

According to some embodiments, the butted contact 166 contacts the first sidewall 180 of the first portion 134' of the dielectric layer 134 and the second sidewall 182 of the first portion 134' of the dielectric layer 134.

According to some embodiments, the first conductive element 108 of the semiconductor arrangement 200 is the gate electrode 109 of the gate stack 110. According to some embodiments, the second conductive element 129 of the semiconductor arrangement 200 is the gate electrode 124 of the gate stack 122. According to some embodiments, the butted contact 166 electrically couples the first conductive element 108 and the second conductive element 129.

According to some embodiments, the first portion 134' of the dielectric layer 134 overlies the source/drain region 131. According to some embodiments, the first portion 134' of the dielectric layer 134 is between the gate stack 110 and the gate stack 122. According to some embodiments, the first portion 134' of the dielectric layer 134 serves to inhibit current flow between the electrically conductive butted contact 166 and the well 106, such as through at least one of the first sidewall spacer 128 or the second sidewall spacer 116.

Figure 9:
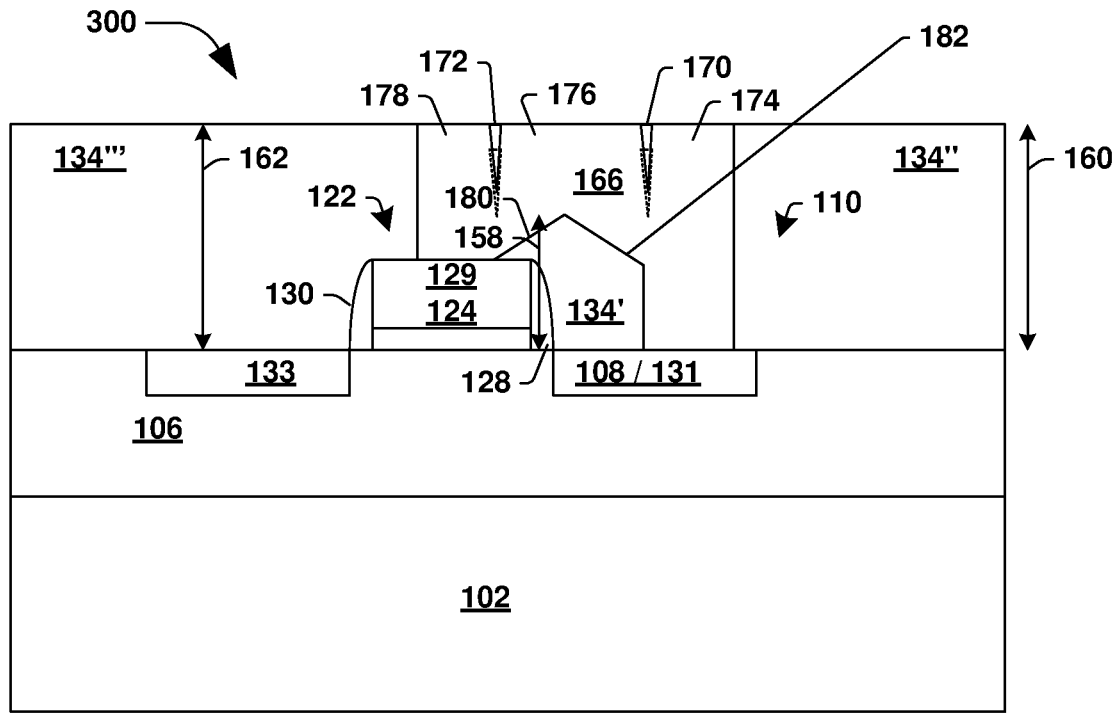
FIG. 9 illustrates an example semiconductor arrangement, in accordance with some embodiments.

FIG. 9 illustrates an example semiconductor arrangement 300, in accordance with some embodiments. According to some embodiments, many of the features present in semiconductor arrangement 300 are present in semiconductor arrangement 100 and thus like reference characters are used in FIG. 9. According to some embodiments, the semiconductor arrangement 300 is formed in in a manner similar to that described with respect to the semiconductor arrangement 100 and thus formation of the semiconductor arrangement 300 is not described in as much detail as the semiconductor arrangement 100.

To form the semiconductor arrangement 300, in accordance with some embodiments, the dielectric layer 134 is formed over at least one of the gate stack 122, the source/drain region 131, the second source/drain region 133, exposed portions of the substrate 102, or exposed portions of the well 106.

As described with respect to the semiconductor arrangement 100, the photoresist is formed over the dielectric layer 134, according to some embodiments. The photoresist is patterned to be define at least the first mask pattern, the second mask pattern, and the third mask pattern, according to some embodiments. In some embodiments, the first mask pattern overlies a location where the first portion 134' of the dielectric layer 134 is formed. In some embodiments, the second mask pattern overlies a location where the second portion 134" of the dielectric layer 134 is formed. According to some embodiments, the third mask pattern overlies a location where the third portion 134''' of the dielectric layer 134 is formed. According to some embodiments, the first mask pattern has the height that is less than at least one of the height of the second mask pattern or the height of the third mask pattern.

The dielectric layer 134 is patterned using the first mask pattern, the second mask pattern, and the third mask pattern of the patterned photoresist, according to some embodiments. According to some embodiments, the dielectric layer 134 is patterned via etching or other suitable process. According to some embodiments, the first mask pattern protects the first portion 134' of the dielectric layer 134 such that the first portion 134' remains after the patterning. According to some embodiments, the second mask pattern protects the second portion 134" of the dielectric layer 134 such that the second portion 134" remains after the patterning. According to some embodiments, the third mask pattern protects the third portion 134''' of the dielectric layer 134 such that the third portion 134''' remains after the patterning. According to some embodiments, the recess is defined between the second portion 134" of the dielectric layer 134 and the third portion 134''' of the dielectric layer 134.

According to some embodiments, due to the smaller height of the first mask pattern relative to at least one of the height of the second mask pattern or the height of the third mask pattern, the first portion 134' of the dielectric layer 134 remaining in the recess has the height that is less than at least one of the height of the second portion 134" of the dielectric layer 134 or the height of the third portion 134''' of the dielectric layer 134.

According to some embodiments, the layer of conductive material is formed in the recess and over at least one of the first portion 134' of the dielectric layer 134, exposed portions of the source/drain region 131, or exposed portions of the gate stack 122. According to some embodiments, excess conductive material is removed from the second portion 134" of the dielectric layer 134 and the third portion 134''' of the dielectric layer 134 such that the butted contact 166 remains in the recess between the second portion 134" of the dielectric layer 134 and the third portion 134''' of the dielectric layer 134. According to some embodiments, an uppermost surface of the butted contact 166 is coplanar with at least one of an uppermost surface of the second portion 134" of the dielectric layer 134 or an uppermost surface of the third portion 134''' of the dielectric layer 134.

According to some embodiments, the butted contact 166 defines the one or more seams, such as the first seam 170 and the second seam 172. According to some embodiments, the first portion 174 of the butted contact 166 is spaced apart from the second portion 176 of the butted contact 166 by the first seam 170. According to some embodiments, the second portion 176 of the butted contact 166 is spaced apart from the third portion 178 of the butted contact 166 by the second seam 172. According to some embodiments, the first portion 134' of the dielectric layer 134 is between the first seam 170 and the second seam 172. According to some embodiments, the first portion 134' of the dielectric layer 134 underlies the second portion 176 of the butted contact 166.

According to some embodiments, the butted contact 166 contacts the first sidewall 180 of the first portion 134' of the dielectric layer 134 and the second sidewall 182 of the first portion 134' of the dielectric layer 134.

According to some embodiments, the first conductive element 108 of the semiconductor arrangement 300 is the source/drain region 131. According to some embodiments, the second conductive element 129 of the semiconductor arrangement 300 is the gate electrode 124 of the gate stack 122. According to some embodiments, the butted contact 166 electrically couples the first conductive element 108 and the second conductive element 129.

According to some embodiments, the first portion 134' of the dielectric layer 134 overlies at least one of the source/drain region 131 or the gate stack 122. According to some embodiments, the first portion 134' of the dielectric layer 134 is between the gate stack 122 and the source/drain region 131. According to some embodiments, the first portion 134' of the dielectric layer 134 serves to inhibit current flow between the electrically conductive butted contact 166 and the well 106, such as through the sidewall spacer 128.

Figure 10:
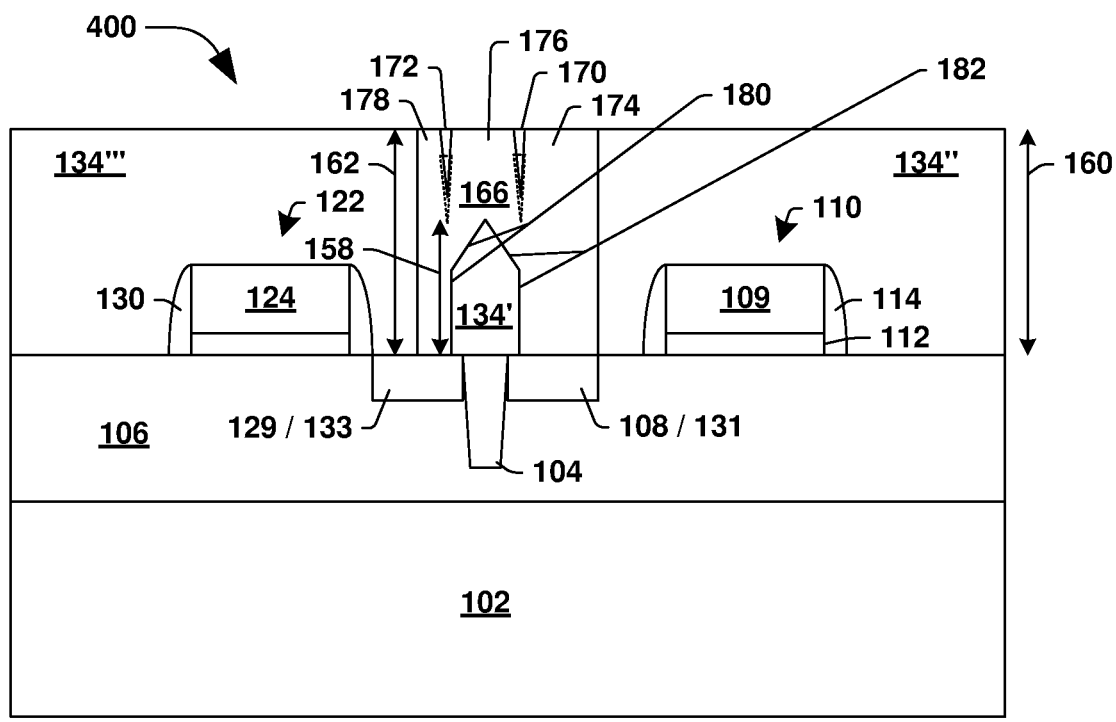
FIG. 10 illustrates an example semiconductor arrangement, in accordance with some embodiments.

FIG. 10 illustrates an example semiconductor arrangement 400, in accordance with some embodiments. According to some embodiments, many of the features present in semiconductor arrangement 400 are present in semiconductor arrangement 100 and thus like reference characters are used in FIG. 10. According to some embodiments, the semiconductor arrangement 400 is formed in in a manner similar to that described with respect to the semiconductor arrangement 100 and thus formation of the semiconductor arrangement 400 is not described in as much detail as the semiconductor arrangement 100.

To form the semiconductor arrangement 400, in accordance with some embodiments, the dielectric layer 134 is formed over at least one of the gate stack 110, the source/drain region 131, the gate stack 122, the second source/drain region 133, exposed portions of the substrate 102, the STI region 104, or exposed portions of the well 106.

As described with respect to the semiconductor arrangement 100, the photoresist is formed over the dielectric layer 134, according to some embodiments. The photoresist is patterned to be define at least the first mask pattern, the second mask pattern, and the third mask pattern, according to some embodiments. In some embodiments, the first mask pattern overlies a location where the first portion 134' of the dielectric layer 134 is formed. In some embodiments, the second mask pattern overlies a location where the second portion 134" of the dielectric layer 134 is formed. According to some embodiments, the third mask pattern overlies a location where the third portion 134''' of the dielectric layer 134 is formed. According to some embodiments, the first mask pattern has the height that is less than at least one of the height 146 of the second mask pattern or the height of the third mask pattern.

The dielectric layer 134 is patterned using the first mask pattern, the second mask pattern, and the third mask pattern of the patterned photoresist, according to some embodiments. According to some embodiments, the dielectric layer 134 is patterned via etching or other suitable process. According to some embodiments, the first mask pattern protects the first portion 134' of the dielectric layer 134 such that the first portion 134' remains after the patterning. According to some embodiments, the second mask pattern protects the second portion 134" of the dielectric layer 134 such that the second portion 134" remains after the patterning. According to some embodiments, the third mask pattern protects the third portion 134''' of the dielectric layer 134 such that the third portion 134''' remains after the patterning. According to some embodiments, the recess is defined between the second portion 134" of the dielectric layer 134 and the third portion 134''' of the dielectric layer 134.

According to some embodiments, due to the smaller height of the first mask pattern relative to at least one of the height of the second mask pattern or the height of the third mask pattern, the first portion 134' of the dielectric layer 134 remaining in the recess has the height that is less than at least one of the height of the second portion 134" of the dielectric layer 134 or the height of the third portion 134''' of the dielectric layer 134.

According to some embodiments, the layer of conductive material is formed in the recess and over at least one of the first portion 134' of the dielectric layer 134, exposed portions of the source/drain region 131, or exposed portions of the second source/drain region 133. According to some embodiments, excess conductive material is removed from the second portion 134" of the dielectric layer 134 and the third portion 134''' of the dielectric layer 134 such that the butted contact 166 remains in the recess between the second portion 134" of the dielectric layer 134 and the third portion 134''' of the dielectric layer 134. According to some embodiments, an uppermost surface of the butted contact 166 is coplanar with at least one of an uppermost surface of the second portion 134" of the dielectric layer 134 or an uppermost surface of the third portion 134''' of the dielectric layer 134.

According to some embodiments, the butted contact 166 defines the one or more seams, such as the first seam 170 and the second seam 172. According to some embodiments, the first portion 174 of the butted contact 166 is spaced apart from the second portion 176 of the butted contact 166 by the first seam 170. According to some embodiments, the second portion 176 of the butted contact 166 is spaced apart from the third portion 178 of the butted contact 166 by the second seam 172. According to some embodiments, the first portion 134' of the dielectric layer 134 is between the first seam 170 and the second seam 172. According to some embodiments, the first portion 134' of the dielectric layer 134 underlies the second portion 176 of the butted contact 166.

According to some embodiments, the butted contact 166 contacts the first sidewall 180 of the first portion 134' of the dielectric layer 134 and the second sidewall 182 of the first portion 134' of the dielectric layer 134.

According to some embodiments, the first conductive element 108 of the semiconductor arrangement 200 is the source/drain region 131. According to some embodiments, the second conductive element 129 of the semiconductor arrangement 200 is the second source/drain region 133. According to some embodiments, the butted contact 166 electrically couples the first conductive element 108 and the second conductive element 129.

According to some embodiments, the STI region 104 separates the first conductive element 108 from the second conductive element 129. According to some embodiments, the first portion 134' of the dielectric layer 134 overlies the STI region 104. According to some embodiments, the first portion 134' of the dielectric layer 134 serves to inhibit current flow between the electrically conductive butted contact 166 and the well 106, such as through the STI region 104.

Figure 11:
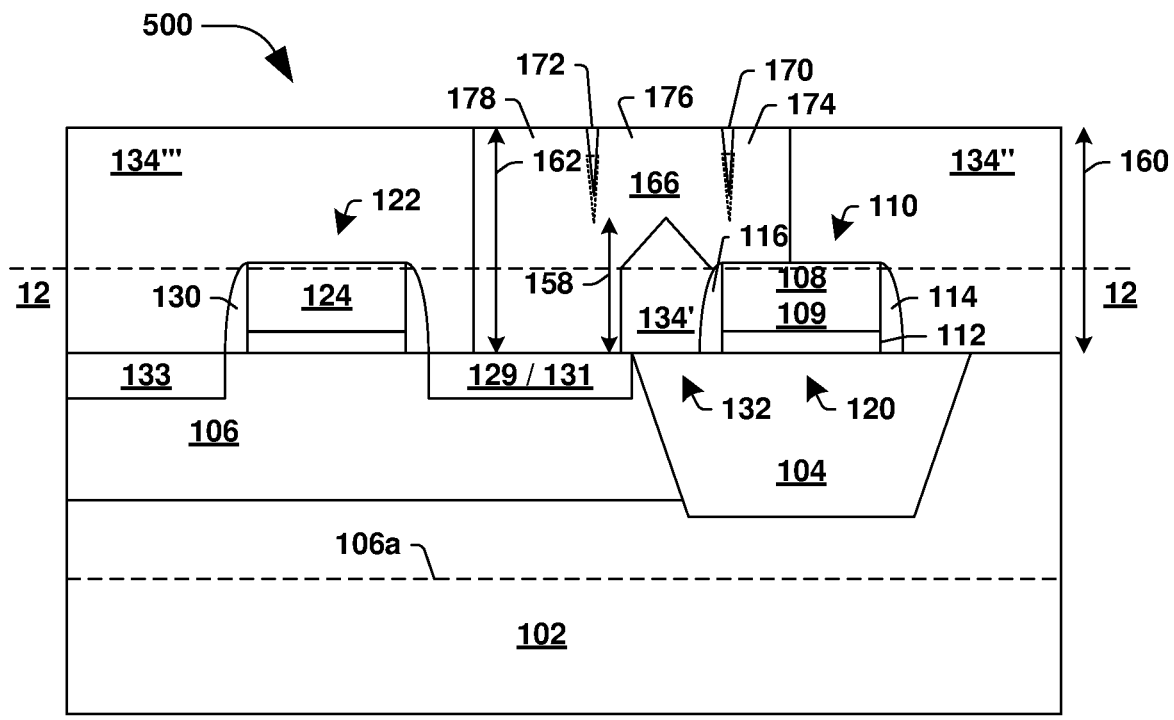
FIG. 11 illustrates an example semiconductor arrangement, in accordance with some embodiments.
Figure 12:
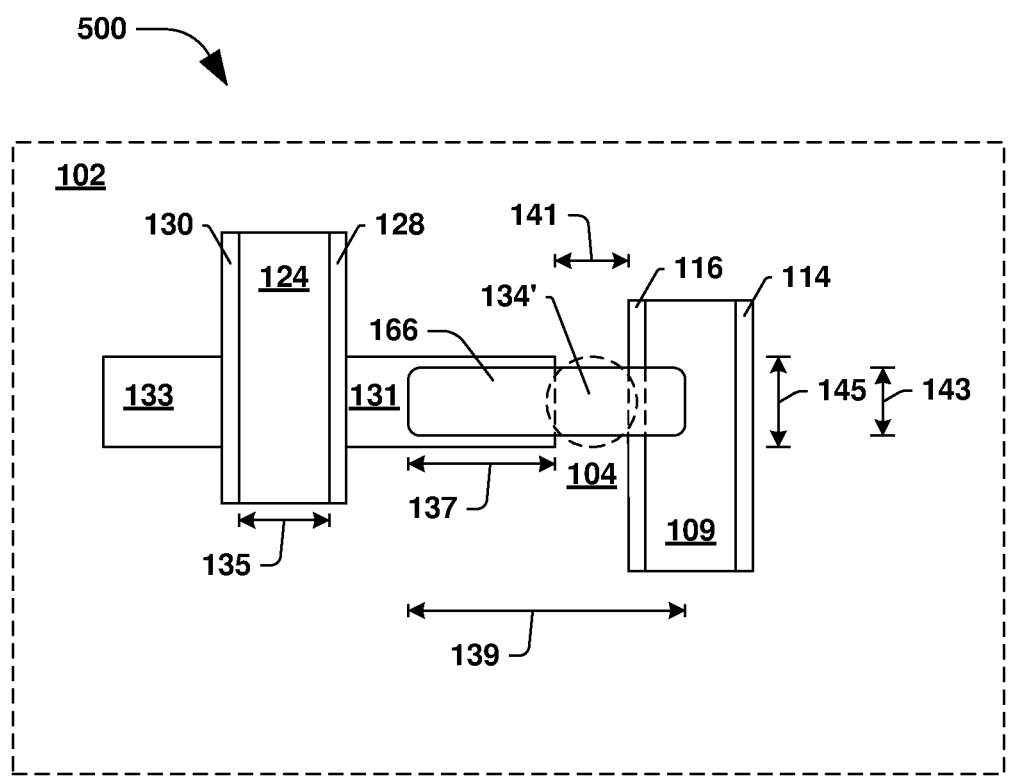
FIG. 12 illustrates a top view of the semiconductor arrangement taken along line 12-12 in FIG. 11, in accordance with some embodiments.

According to some embodiments, variations to at least the foregoing are contemplated. FIG. 11 and FIG. 12 illustrate an example semiconductor arrangement 500, in accordance with some embodiments. FIG. 12 illustrates a top view of the semiconductor arrangement 500 taken along line 12-12 in FIG. 11, but with the second portion 134" and the third portion 134''' of the dielectric layer 134 omitted for simplicity, in accordance with some embodiments. According to some embodiments, many of the features present in semiconductor arrangement 500 are present in semiconductor arrangement 100 and thus like reference characters are used in FIG. 11 and FIG. 12. According to some embodiments, the semiconductor arrangement 500 is formed in in a manner similar to that described with respect to the semiconductor arrangement 100 and thus formation of the semiconductor arrangement 500 is not described in as much detail as the semiconductor arrangement 100. FIG. 11 is similar to FIG. 6 but with one or more contemplated variations. FIG. 12 is similar to FIG. 7 but with one or more contemplated variations. According to some embodiments, the dielectric layer is patterned so that the first portion 134' of the dielectric layer 134 overlies at least one of at least some of the second sidewall spacer 116 or at least some of the source/drain region 131. According to some embodiments, the dielectric layer is patterned so that the thickness 143 of the butted contact 166 is less than or equal to a thickness 145 of the first portion 134' of the dielectric layer 134. Additional variations are contemplated, according to some embodiments.

According to some embodiments, a semiconductor arrangement and method of forming are described herein. The semiconductor arrangement includes a dielectric region under a butted contact and between a first conductive element and a second conductive element. The butted contact is a conductive element that is over the first conductive element and the second conductive element, and electrically couples the first conductive element to the second conductive element. The dielectric region is remnant of a dielectric layer. The dielectric region is over a top surface of a substrate, where the first conductive element is at least one of over the substrate or in the substrate and the second conductive element is at least one of over the substrate or in the substrate. The dielectric region inhibits current leakage between a well in the substrate and the electrically conductive butted contact.

According to some embodiments, a method of forming a semiconductor arrangement is provided. The method includes forming a first conductive element and a second conductive element, depositing a dielectric layer over the first conductive element and the second conductive element, forming a first mask pattern over a first portion of the dielectric layer between the first conductive element and the second conductive element, etching the dielectric layer to define a recess exposing the first conductive element and the second conductive element, wherein a remnant of the first portion of the dielectric layer remains after the etching; and forming an electrically conductive structure in the recess and over the remnant.

According to some embodiments, forming the electrically conductive structure includes forming the electrically conductive structure over the first conductive element and the second conductive element.

According to some embodiments, the method includes forming a second mask pattern over a second portion of the dielectric layer over a portion of the first conductive element, wherein the first mask pattern has a first height and the second mask pattern has a second height greater than the first height.

According to some embodiments, the method includes concurrently forming the first mask pattern and the second mask pattern.

According to some embodiments, a semiconductor arrangement is provided. According to some embodiments, the semiconductor arrangement includes a first conductive element over a substrate, a second conductive element over the substrate, a dielectric region over a top surface of the substrate and between the first conductive element and the second conductive element, and an electrically conductive structure over the first conductive element, the second conductive element, and the dielectric region.

According to some embodiments, the electrically conductive structure includes a butted contact.

According to some embodiments, the dielectric region overlies a sidewall spacer of the first conductive element.

According to some embodiments, the first conductive element includes a gate electrode of a gate stack, and the second conductive element includes a source/drain region.

According to some embodiments, the gate electrode is electrically coupled to the source/drain region.

According to some embodiments, a shallow trench isolation (STI) region is in the substrate between the first conductive element and the second conductive element, and the dielectric region is over the STI region.

According to some embodiments, the first conductive element includes a first source/drain region, and the second conductive element includes a second source/drain region separated from the first source/drain region by the STI region.

According to some embodiments, the first conductive element includes a gate electrode of a gate stack overlying a first portion of the STI region, the second conductive element includes a source/drain region separated from the gate stack by a second portion of the STI region, and the dielectric region is over the second portion of the STI region.

According to some embodiments, the electrically conductive structure defines a first seam by which a first portion of the electrically conductive structure is spaced apart from a second portion of the electrically conductive structure.

According to some embodiments, the electrically conductive structure defines a second seam by which the second portion of the electrically conductive structure is spaced apart from a third portion of the electrically conductive structure.

According to some embodiments, the dielectric region is between the first seam and the second seam.

According to some embodiments, the dielectric region underlies the second portion of the electrically conductive structure.

According to some embodiments, a method of forming a semiconductor arrangement is provided. The method includes forming a dielectric region over a top surface of a substrate and between a first conductive element and a second conductive element, wherein the first conductive element is at least one of over the substrate or in the substrate and the second conductive element is at least one of over the substrate or in the substrate, and forming an electrically conductive structure over the dielectric region, the first conductive element, and the second conductive element to electrically couple the first conductive element and the second conductive element.

According to some embodiments, forming the dielectric region includes forming a dielectric layer over the top surface of the substrate, the first conductive element, and the second conductive element, and patterning the dielectric layer to form the dielectric region and expose the first conductive element and the second conductive element.

According to some embodiments, the dielectric region has a first sidewall and a second sidewall and forming the electrically conductive structure includes forming the electrically conductive structure to contact the first sidewall and the second sidewall.

According to some embodiments, the first sidewall is diametrically opposite the second sidewall relative to a center of the dielectric region.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

Although the subject matter has been described in language specific to structural features or methodological acts, it is to be understood that the subject matter of the appended claims is not necessarily limited to the specific features or acts described above. Rather, the specific features and acts described above are disclosed as example forms of implementing at least some of the claims.

Various operations of embodiments are provided herein. The order in which some or all of the operations are described should not be construed to imply that these operations are necessarily order dependent. Alternative ordering will be appreciated having the benefit of this description. Further, it will be understood that not all operations are necessarily present in each embodiment provided herein. Also, it will be understood that not all operations are necessary in some embodiments.

It will be appreciated that layers, features, elements, etc. depicted herein are illustrated with particular dimensions relative to one another, such as structural dimensions or orientations, for example, for purposes of simplicity and ease of understanding and that actual dimensions of the same differ substantially from that illustrated herein, in some embodiments. Additionally, a variety of techniques exist for forming the layers, regions, features, elements, etc. mentioned herein, such as at least one of etching techniques, planarization techniques, implanting techniques, doping techniques, spin-on techniques, sputtering techniques, growth techniques, or deposition techniques such as chemical vapor deposition (CVD), for example.

Moreover, "exemplary" is used herein to mean serving as an example, instance, illustration, etc., and not necessarily as advantageous. As used in this application, "or" is intended to mean an inclusive "or" rather than an exclusive "or". In addition, "a" and "an" as used in this application and the appended claims are generally be construed to mean "one or more" unless specified otherwise or clear from context to be directed to a singular form. Also, at least one of A and B and/or the like generally means A or B or both A and B. Furthermore, to the extent that "includes", "having", "has", "with", or variants thereof are used, such terms are intended to be inclusive in a manner similar to the term "comprising". Also, unless specified otherwise, "first," "second," or the like are not intended to imply a temporal aspect, a spatial aspect, an ordering, etc. Rather, such terms are merely used as identifiers, names, etc. for features, elements, items, etc. For example, a first element and a second element generally correspond to element A and element B or two different or two identical elements or the same element.

Also, although the disclosure has been shown and described with respect to one or more implementations, equivalent alterations and modifications will occur to others of ordinary skill in the art based upon a reading and understanding of this specification and the annexed drawings. The disclosure comprises all such modifications and alterations and is limited only by the scope of the following claims. In particular regard to the various functions performed by the above described components (e.g., elements, resources, etc.), the terms used to describe such components are intended to correspond, unless otherwise indicated, to any component which performs the specified function of the described component (e.g., that is functionally equivalent), even though not structurally equivalent to the disclosed structure. In addition, while a particular feature of the disclosure may have been disclosed with respect to only one of several implementations, such feature may be combined with one or more other features of the other implementations as may be desired and advantageous for any given or particular application.

What is claimed is:

1. A semiconductor arrangement, comprising:
   a first conductive element over a substrate;
   a second conductive element over the substrate;
   a dielectric region over a top surface of the substrate and between the first conductive element and the second conductive element; and
   an electrically conductive structure over the first conductive element, the second conductive element, and the dielectric region, wherein the electrically conductive structure defines a first seam by which a first portion of the electrically conductive structure is spaced apart from a second portion of the electrically conductive structure.

2. The semiconductor arrangement of claim 1, wherein the electrically conductive structure comprises a butted contact.

3. The semiconductor arrangement of claim 1, wherein the dielectric region overlies a sidewall spacer of the first conductive element.

4. The semiconductor arrangement of claim 1, wherein:
   the first conductive element comprises a gate electrode of a gate stack, and
   the second conductive element comprises a source/drain region.

5. The semiconductor arrangement of claim 4, wherein the gate electrode is electrically coupled to the source/drain region.

6. The semiconductor arrangement of claim 1, wherein:
   a shallow trench isolation (STI) region is in the substrate between the first conductive element and the second conductive element, and
   the dielectric region is over the STI region.

7. The semiconductor arrangement of claim 6, wherein:
   the first conductive element comprises a first source/drain region, and
   the second conductive element comprises a second source/drain region separated from the first source/drain region by the STI region.

8. The semiconductor arrangement of claim 6, wherein:
   the first conductive element comprises a gate electrode of a gate stack overlying a first portion of the STI region,
   the second conductive element comprises a source/drain region separated from the gate stack by a second portion of the STI region, and
   the dielectric region is over the second portion of the STI region.

9. The semiconductor arrangement of claim 1, wherein the electrically conductive structure defines a second seam by which the second portion of the electrically conductive structure is spaced apart from a third portion of the electrically conductive structure.

10. The semiconductor arrangement of claim 9, wherein the dielectric region is between the first seam and the second seam.

11. The semiconductor arrangement of claim 1, wherein the dielectric region underlies the second portion of the electrically conductive structure.

12. A semiconductor arrangement, comprising:
    a first dielectric region over a top surface of a substrate; and
    an electrically conductive structure over and laterally adjacent to the first dielectric region, wherein:
       the electrically conductive structure defines a first seam and a second seam,
       a first portion of the electrically conductive structure is disposed between the first seam and the second seam, and
       the first dielectric region underlies the first portion of the electrically conductive structure.

13. The semiconductor arrangement of claim 12, comprising:
    a second dielectric region spaced apart from the first dielectric region by the electrically conductive structure.

14. The semiconductor arrangement of claim 13, wherein:
    a second portion of the electrically conductive structure is disposed between the first seam and the second dielectric region.

15. The semiconductor arrangement of claim 12, wherein the first dielectric region comprises a non-planar top surface.

16. The semiconductor arrangement of claim 12, wherein the electrically conductive structure is in contact with a sidewall of the first dielectric region.

17. A semiconductor arrangement, comprising:
    a first dielectric region over a top surface of a substrate, wherein the first dielectric region comprises a non-planar top surface; and
    an electrically conductive structure in contact with the non-planar top surface of the first dielectric region and a sidewall of the first dielectric region, wherein:
       the electrically conductive structure defines a first seam and a second seam, a first portion of the electrically conductive structure is disposed between the first seam and the second seam, and the first dielectric region underlies the first portion of the electrically conductive structure.

18. The semiconductor arrangement of claim 17, wherein the first dielectric region overlies a shallow trench isolation (STI) region.

19. The semiconductor arrangement of claim 17, wherein:

the first dielectric region has a first height at a first horizontal location, a second height at a second horizontal location, and a third height a third horizontal location, the second horizontal location is between the first horizontal location and the third horizontal location, and the second height is greater than the first height and the third height.

20. The semiconductor arrangement of claim 17, comprising:

a gate structure, wherein the first dielectric region and the electrically conductive structure are in contact with a sidewall spacer of the gate structure.

* * * * *